United States Patent

Uenishi et al.

Patent Number: 5,173,389
Date of Patent: Dec. 22, 1992

[54] POSITIVE-WORKING PHOTORESIST COMPOSITION

[75] Inventors: Kazuya Uenishi; Shinji Sakaguchi; Tadayoshi Kokubo, all of Shizuoka, Japan

[73] Assignee: Fuji Photo Film Co., Ltd., Kanagawa, Japan

[21] Appl. No.: 514,811

[22] Filed: Apr. 26, 1990
(Under 37 CFR 1.47)

[30] Foreign Application Priority Data

Apr. 26, 1989 [JP] Japan ............... 1-107013

[51] Int. Cl.$^5$ .................... G03F 7/023; G03F 7/32
[52] U.S. Cl. .................... 430/192; 430/165; 430/190; 430/193; 430/326; 534/557
[58] Field of Search ............... 430/190, 192, 193, 165, 430/326; 534/557

[56] References Cited

U.S. PATENT DOCUMENTS

| | | | |
|---|---|---|---|
| 3,130,049 | 4/1964 | Neugebauer et al. | 430/192 |
| 4,407,926 | 10/1983 | Stahlhofer | 430/165 |
| 4,517,275 | 5/1985 | Stahlhofer | 430/165 |
| 4,555,469 | 11/1985 | Erdmann et al. | 430/190 |
| 4,626,492 | 12/1986 | Eilbeck et al. | 430/193 |
| 4,628,020 | 12/1986 | Stahlhofer | 430/165 |
| 4,883,739 | 11/1989 | Sakaguchi et al. | 430/192 |
| 5,019,478 | 5/1991 | Toukhy et al. | 430/192 |

FOREIGN PATENT DOCUMENTS 57-63526 4/1982 Japan.
1-144463 6/1989 Japan.

Primary Examiner—Charles L. Bowers, Jr.
Assistant Examiner—John S. Y. Chu
Attorney, Agent, or Firm—Sughrue, Mion, Zinn, Macpeak & Seas

[57] ABSTRACT

A positive-working photoresist composition is disclosed, which comprises (1) a light-sensitive material obtained by reacting a polyhydroxy compound containing at least one group represented by the following general formula (I) per molecule with at least one of 1,2-naphthoquinonediazido-5-sulfonyl chloride and 1,2-naphthoquinonediazido-4-sulfonyl chloride, and (2) an alkali-soluble novolak resin:

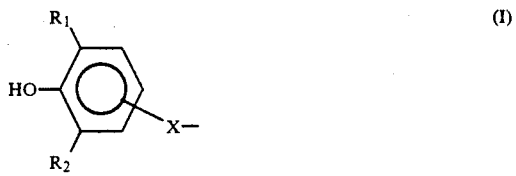

wherein $R_1$ and $R_2$ each represents a hydrogen atom or a $C_1$-$C_4$ straight or branched alkyl or alkoxy group, provided that $R_1$ and $R_2$ do not represent hydrogen atoms at the same time; and X represents a divalent organic group.

13 Claims, No Drawings

POSITIVE-WORKING PHOTORESIST COMPOSITION

FIELD OF THE INVENTION

This invention relates to a positive-working photoresist composition which responds to radiation and, more particularly, to a photoresist composition having a high resolving power and a high sensitivity and one capable of forming micropatterns with good profiles.

BACKGROUND OF THE INVENTION

As positive-working photoresist compositions, those compositions which contain an alkali-soluble resin and a light-sensitive naphthoquinonediazide compound are generally used. For example, compositions containing a "novolak phenol resin/naphthoquinonediazide-substituted compound" are described in U.S. Pat. Nos. 3,666,473, 4,115,128, 4,173,470, etc., and examples of a "novolak resin composed of cresol-formaldehyde/trihydroxybenzophenone-1,2-naphthoquinonediazidosulfonic acid esters" are described in L. F. Thompson, *Introduction to Microlithography* (published by ACS, No. 219), pp. 112–121.

The novolak resin used as a binder is particularly useful since it is soluble in an alkali aqueous solution without swelling and shows a high resistance particularly against plasma etching when using an image formed therein as a mask for etching. The naphthoquinonediazide compound used as a light-sensitive material decreases alkali solubility of the novolak resin and, when decomposed by irradiation with light, produces an alkali-soluble substance and actually increases the alkali solubility of the novolak resin. The naphthoquinonediazide compound is particularly useful because of this great change in its properties induced by light.

Many positive-working photoresists containing the novolak resin and the naphthoquinonediazide light-sensitive material have so far been developed and put into practice in view of the above-described advantages, and sufficient results have been obtained in forming lines with a width of about 1.5 μm to about 2 μm.

However, the degree of integration of integrated circuits is increasing more and more and, in manufacturing semiconductor bases such as VLSI, formation of ultramicro-patterns with a line width as narrow as 1 μm is required. For such uses, the conventional positive photoresists described above are insufficient, and photoresists having a high resolving power, an ability to accurately reproduce a pattern of an exposure mask, and a high sensitivity for attaining high productivity are required.

SUMMARY OF THE INVENTION

An object of the present invention is to provide a positive-working photoresist composition having the following advantages in manufacture of semiconductor devices:

(1) shows a high resolving power;
(2) is capable of accurately reproducing a mask dimension of photomask lines with a wide range of line widths;
(3) is capable of forming a resist pattern as narrow as 1 μm in line width having a sectional profile with a high aspect ratio;
(4) is capable of forming a pattern having approximately vertical side walls in the pattern profile;
(5) has a broad development latitude; and
(6) provides a resist image having an excellent heat resistance.

As a result of intensive investigations with the above-described properties in mind, the present inventors have found that this and other objects can be attained by a positive-working photoresist composition which comprises (1) a light sensitive material obtained by reacting a polyhydroxy compound containing at least one group represented by the following general formula (I) per molecule with at least one of 1,2-naphthoquinonediazido-5-sulfonyl chloride and 1,2-naphthoquinonediazido-4-sulfonyl chloride, and (2) an alkali-soluble novolak resin:

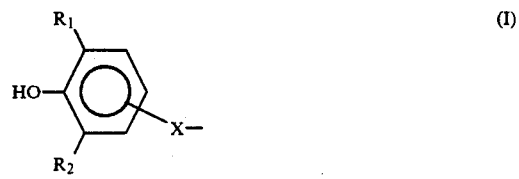

wherein $R_1$ and $R_2$ each represents a hydrogen atom or a $C_1$–$C_4$ straight or branched alkyl or alkoxy group, provided that $R_1$ and $R_2$ do not represent hydrogen atoms at the same time; and X represents a divalent organic group.

DETAILED DESCRIPTION OF THE INVENTION

The present invention is described in more detail below.

In the general formula (I), when one of $R_1$ and $R_2$ represents a hydrogen atom, the other preferably represents a $C_2$–$C_4$ straight or branched alkyl or alkoxy group. More preferably, both of $R_1$ and $R_2$ represent $C_1$–$C_4$ straight or branched alkyl or alkoxy groups, which may be the same or different. Specific examples of the alkyl group include methyl, n-propyl, iso-propyl, n-butyl, sec-butyl, t-butyl groups, and specific examples of the alkoxy group include methoxy, n-propoxy, iso-propoxy, n-butoxy, sec-butoxy, t-butoxy groups.

The linking group X in the general formula (I) represents a divalent organic group, preferably a $C_1$–$C_4$ straight or branched alkylene group,

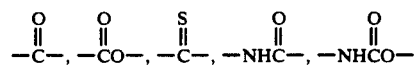

or —O—, more preferably a $C_1$–$C_4$ straight or branched alkylene group,

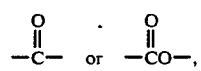

most preferably a $C_1$–$C_4$ straight or branched alkylene group.

Preferred examples of the light-sensitive material obtained by reacting a polyhydroxy compound containing at least one group represented by the general formula (I) per molecule with 1,2-naphthoquinonediazido-5-sulfonyl chloride and/or 1,2-naphthoquinonediazido- 4-sulfonyl chloride are those which are represented by the general formulae (II) to (IX) below.

The polyhydroxy compounds used in the present invention are those which contain one or more hydroxy groups per molecule. Specific examples of the polyhydroxy compounds include polyhydroxy compounds represented by the general formulae (II') to (IX') described hereinafter, bis(polyhydroxybenzoyl)alkanes such as bis(2,3,4-trihydroxybenzoyl)methane, bis(polyhydroxybenzoyl)benzenes such as p-bis(2,3,4-trihydroxybenzoyl)benzene, alkanediols such as ethylene glycol di(3,4,5-trihydroxybenzoate), α-pyrone natural dyes, γ-pyrone natural dyes such as quercetin and rutin, diazine natural dyes such as leucopterin, quinone natural dyes such as alizarin and purpurin, poly(hydroxystyrene), and resins such a novolak resin and pyrogallol-/acetone condensate resin. Of these polyhydroxy compounds, those compounds which are represented by the general formulae (II') to (IX') to be described below are preferable.

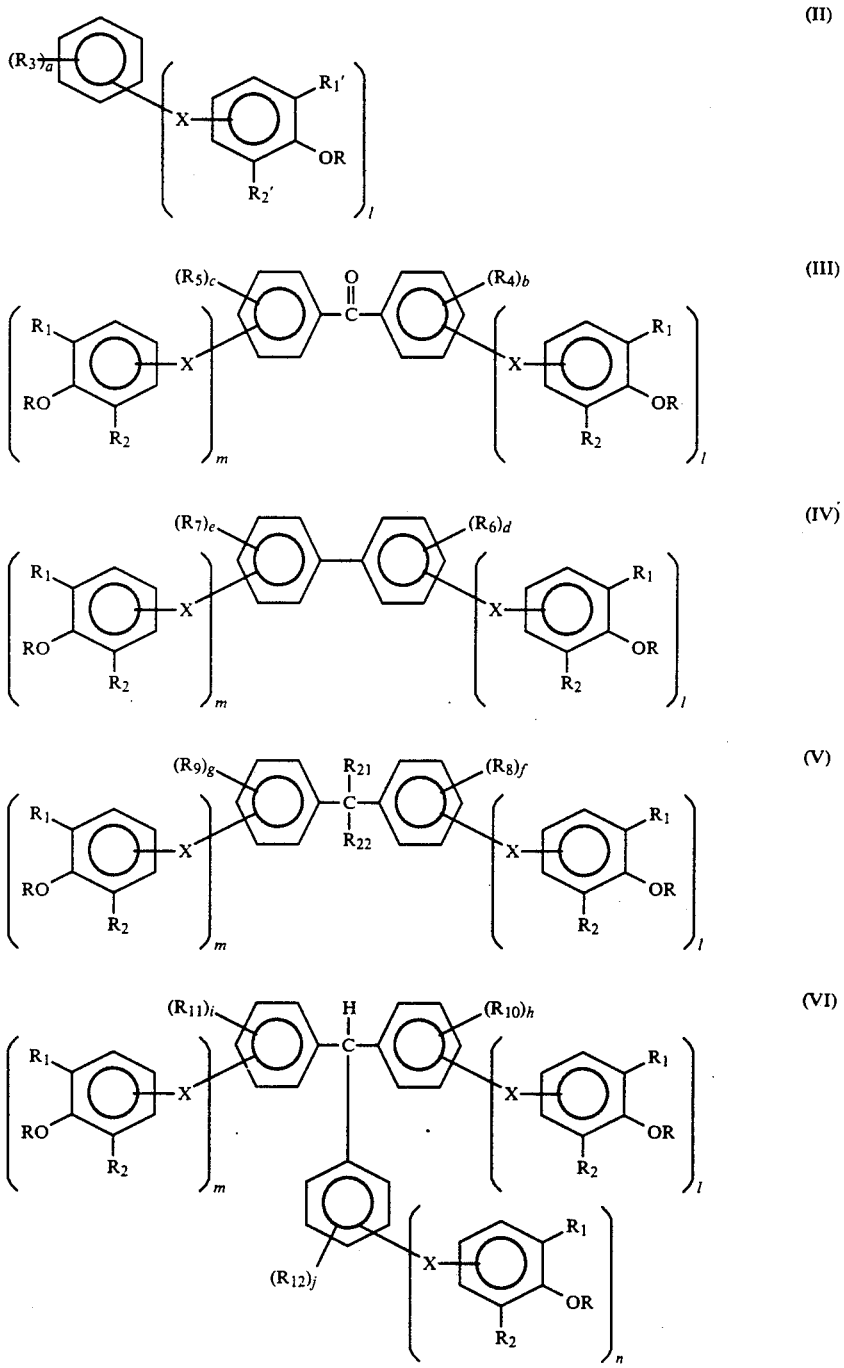

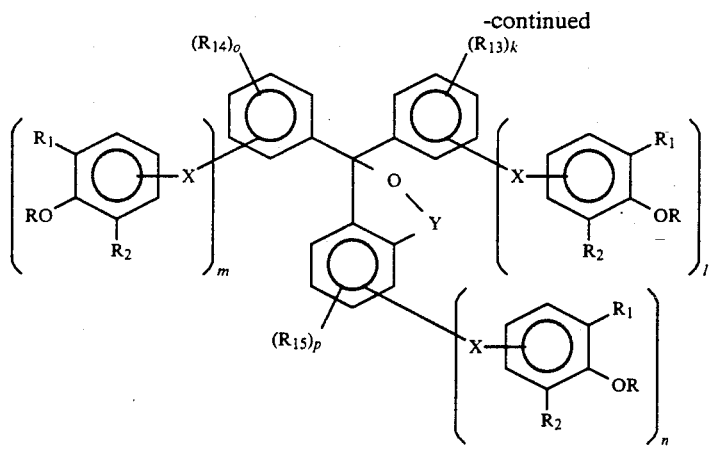
(VII)

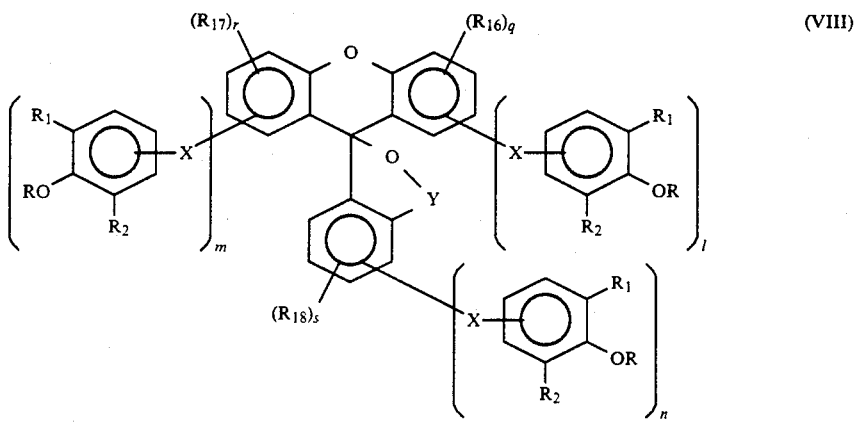
(VIII)

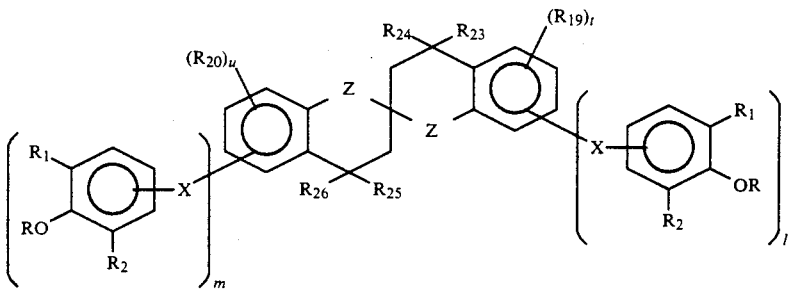
(IX)

In the above general formulae (II) to (IX), $R_1'$ and $R'$ each represents a $C_1$-$C_4$ straight or branched alkyl or alkoxy group; $R_1$ and $R_2$ each represents a hydrogen atom, or a $C_1$-$C_4$ straight or branched alkyl or alkoxy group, provided that $R_1$ and $R_2$ do not represent hydrogen atoms at the same time; X represents a divalent organic group (preferably a $C_1$-$C_4$ straight or branched alkylene group,

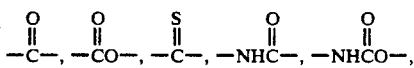

—S— or —O—, more preferably a $C_1$-$C_4$ straight or branched alkylene group,

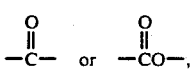

and most preferably a $C_1$-$C_4$ straight or branched alkylene group); R represents —H,

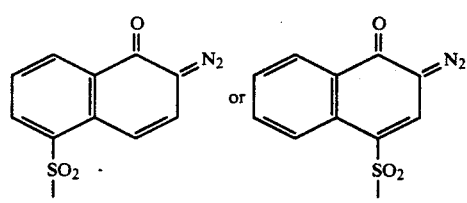

(which may be the same or different); $R_3$ to $R_{20}$, which may be the same or different, each represent —H, —OH, a substituted or unsubstituted alkyl group, a substituted or unsubstituted alkoxy group, a substituted or unsubstituted aryl group, a substituted or unsubstituted aralkyl group, a substituted or unsubstituted acyl group, a substituted or unsubstituted acyloxy group

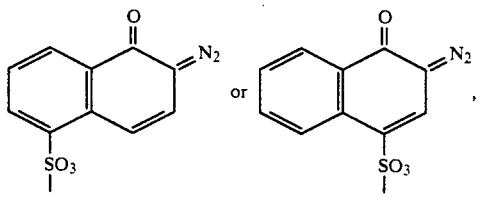

provided that

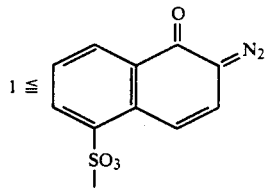

and/or

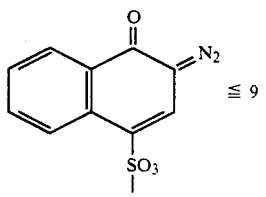

within one molecule of the light-sensitive material; $R_{21}$ to $R_{26}$ each represents —H, —OH, —COOH, —CN, a halogen atom, —COOR$_{27}$, —R$_{28}$—COOH, —R$_{29}$—COOR$_{30}$ (wherein $R_{27}$ and $R_{30}$ each represents a substituted or unsubstituted alkyl group, a substituted or unsubstituted aryl group, a substituted or unsubstituted aralkyl group, and $R_{28}$ and $R_{29}$ each represents a substituted or unsubstituted alkylene group or a substituted or unsubstituted arylene group), a substituted or unsubstituted alkyl group, a substituted or unsubstituted alkoxy group, or a substituted or unsubstituted aralkyl group; Y represents

or —SO$_2$—; Z represents an oxygen atom or a single bond; and a to u represent real numbers satisfying the following conditions:

$1 \leq l \leq 4$,
$0 \leq m, n \leq 4$,
$0 \leq a$ to $k$, and $o$ to $u \leq 5$.

The light-sensitive materials represented by the general formulae (II) to (IX) can be obtained by reacting the polyhydroxy compounds represented by the following general formulae (II') to (IX') with 1,2-naphthoquinonediazido-5-sulfonyl chloride and/or 1,2-naphthoquinonediazido-4-sulfonyl chloride.

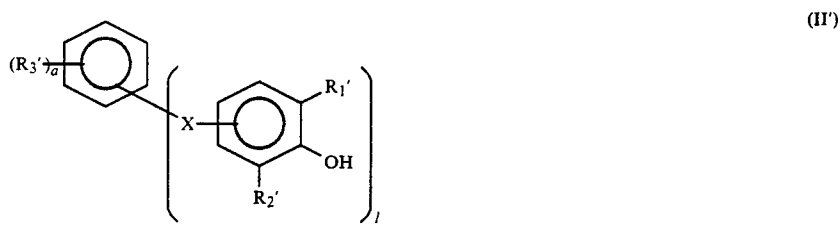

(II')

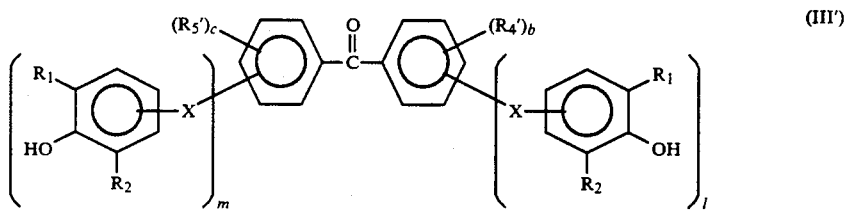

(III')

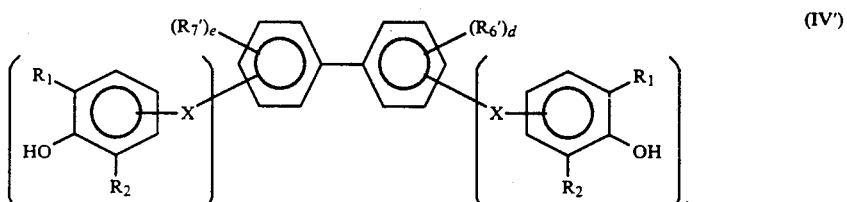

(IV')

-continued
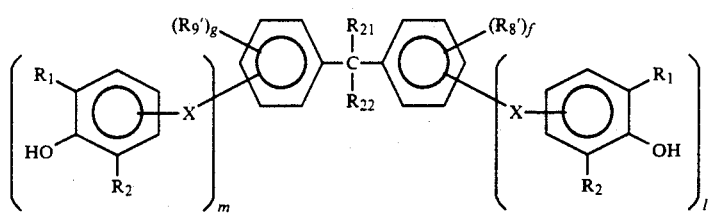
(V')
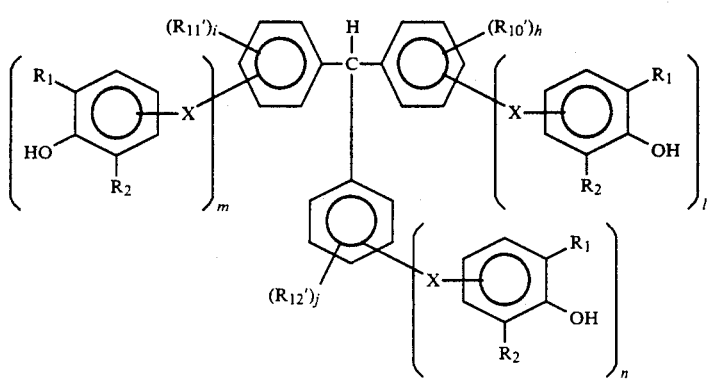
(VI')
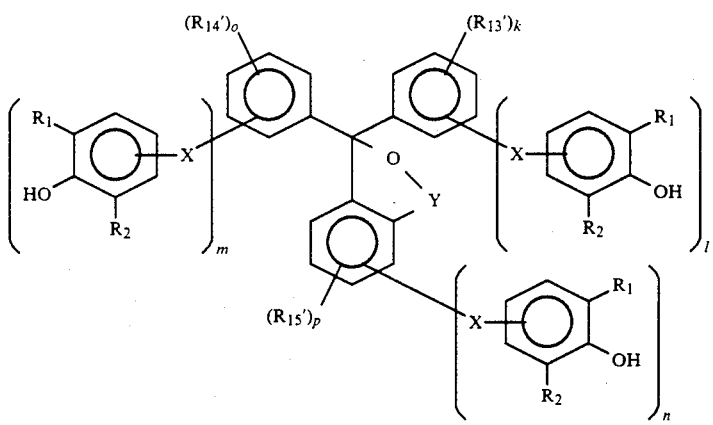
(VII')
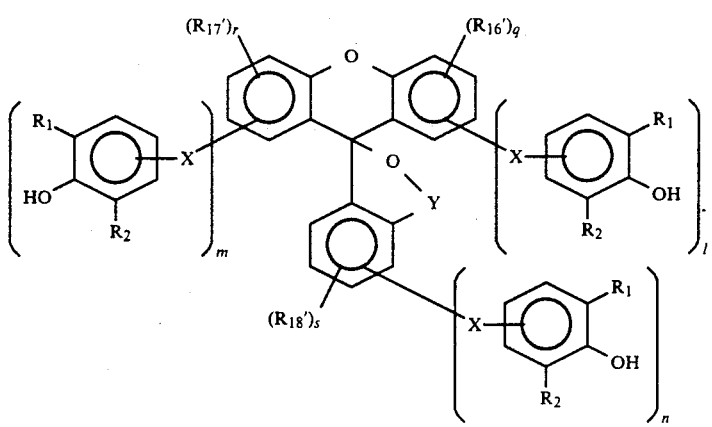
(VIII')

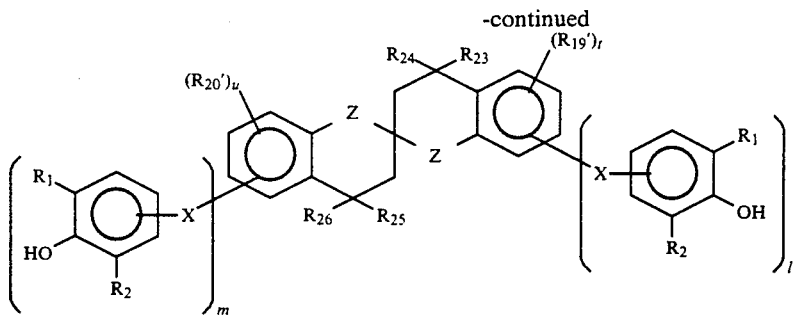

In the above general formulae (II') to (IX') $R_1'$ and $R_2'$ each represents a $C_1$-$C_4$ straight or branched alkyl or alkoxy group; $R_1$ and $R_2$ each represents a hydrogen atom, or a $C_1$-$C_4$ straight or branched alkyl or alkoxy group, provided that $R_1$ and $R_2$ do not represent hydrogen atoms at the same time; X represents a divalent organic group (preferably a $C_1$-$C_4$ straight or branched alkylene group,

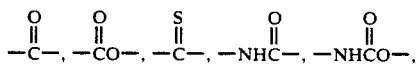

—S— or —O—, more preferably a $C_1$-$C_4$ straight or branched alkylene group,

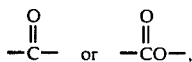

and most preferably a $C_1$-$C_4$ straight or branched alkylene group); $R_3'$ to $R_{20}'$, which may be the same or different, each represents —H, —OH, a substituted or unsubstituted alkyl group, a substituted or unsubstituted alkoxy group, a substituted or unsubstituted aryl group, a substituted or unsubstituted aralkyl group, a substituted or unsubstituted acyl group, or a substituted or unsubstituted acyloxy group, provided that $$1 \leq -OH \leq 9$$

per molecule; $R_{21}$ to $R_{26}$ each represents —H, —OH, —COOH, —CN, a halogen atom, $COOR_{27}$, —$R_{28}$—COOH, —$R_{29}$—$COOR_{30}$ (wherein $R_{27}$ and $R_{30}$ each represents a substituted or unsubstituted alkyl group, a substituted or unsubstituted aryl group, or a substituted or unsubstituted aralkyl group, and $R_{28}$ and $R_{29}$ each represents a substituted or unsubstituted alkylene group or a substituted or unsubstituted arylene group), a substituted or unsubstituted alkyl group, a substituted or unsubstituted alkoxy group, or a substituted or unsubstituted aralkyl group; Y represents

or —$SO_2$—; Z represents an oxygen atom or a single bond; and a to u represent real numbers satisfying the following conditions:

$1 \leq l \leq 4$,
$0 \leq m, n \leq 4$,
$0 \leq a$ to $k$, and $o$ to $u \leq 5$.

The polyhydroxy compounds having at least one group represented by the general formula (I) per molecule (for example, (II') to (IX')) can be obtained by introducing the group represented by general formula (I) into the starting polyhydroxy compounds according to the reactions illustrated hereinafter. In this case, where the starting polyhydroxy compounds have a plurality of reactive sites, the products are obtained as a mixture which may also be used in the present invention. The term "starting polyhydroxy compound" as used herein and in the following reaction schemes means the compounds corresponding to formulae (II') to (IX') but containing no group represented by formula (I).

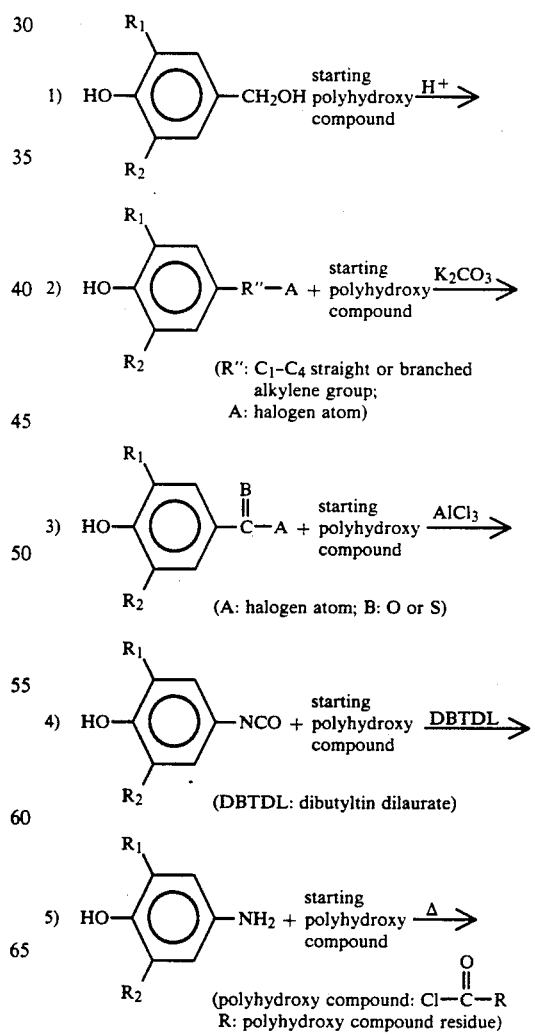

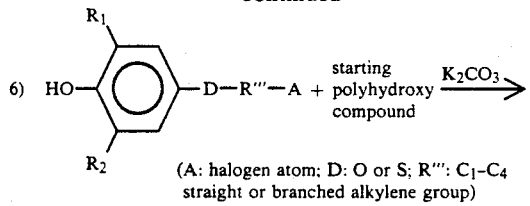

6) (A: halogen atom; D: O or S; R'''': $C_1$-$C_4$ straight or branched alkylene group)

With respect to the groups of $R_3'$ to $R_{20}'$ and $R_{23}$ to $R_{26}$ other than —H and —OH, and with respect to the groups of $R_1$ and $R_{22}$ other than —H, —OH, —COOH, —CN, a halogen atom, —COOR$_{27}$, —R$_{28}$—COOH and —R$_{29}$—COOR$_{30}$, each of these groups preferably represents an alkyl or alkoxy group containing 1 to 8 carbon atoms, an aryl or aralkyl group containing 6 to 15 carbon atoms, an alkyl or alkoxy group containing 1 to 8 carbon atoms which is substituted with an alkoxy group, an aryloxy group, an aryl group, a hydroxyl group, a carboxyl group, a sulfonic acid group, an amino group, a nitro group, a silyl group, a silyl ether group, a cyano group, an aldehyde group, a mercapto group, a halogen atom, etc., an aryl or aralkyl group containing 6 to 15 carbon atoms which is substituted with an alkoxy group, an aryloxy group, an aryl group, a hydroxyl group, a carboxyl group, a sulfo group, an amino group, a nitro group, a silyl group, a silyl ether group, a cyano group, an aldehyde group, a mercapto group, a halogen atom, etc., an aliphatic or aromatic aryl group containing 2 to 15 carbon atoms, or an acyloxy group.

The esterification reaction between the polyhydroxy compound represented by one of the general formulae (II') to (IX') and 1,2-naphthoquinonediazido-5-sulfonyl chloride and/or 1,2-naphthoquinonediazido-4-sulfonyl chloride is conducted in a conventional manner as described in, for example, U.S. Pat. No. 4,639,406. That is, predetermined amounts of the polyhydroxy compound represented by one of the general formulae (II') to (IX'), 1,2-naphthoquinonediazido-5 sulfonyl chloride and/or 1,2-naphthoquinonediazido-4-sulfonyl chloride, and a solvent such as dioxane, acetone, methyl ethyl ketone or N-methylpyrrolidone were charged in a flask, and a basic catalyst such as sodium hydroxide, sodium carbonate, sodium hydrogencarbonate or triethylamine was dropwise added thereto to conduct the condensation reaction. The resulting product is washed with water, purified, and dried. Light-sensitive materials represented by, for example, the general formulae (II) to (IX) can be obtained in the above-described manner.

As a result of the above-described esterification reaction, there is obtained a mixture of compounds different from each other in esterification number and esterification position. Therefore, the term "esterification ratio" as used herein in the present invention is defined as an average value of the mixture.

The alkali-soluble novolak resin may be obtained by addition condensation between 1 mol of a phenol and 0.6 to 1.0 mol of an aldehyde in the presence of an acidic catalyst. Examples of the phenol which can be used include phenol, o-cresol, m-cresol, p-cresol, xylenol, naphthol, etc., either independently or as a combination of two or more. Examples of the aldehyde which can be used include formaldehyde, para-formaldehyde, acetaldehyde, halogenated acetaldehyde (e.g., chloro- or bromo-), furfural, etc. Examples of the acidic catalyst which can be used include hydrochloric acid, sulfuric acid, formic acid, oxalic acid, acetic acid, etc. The thus-obtained novolak resin having a molecular weight of 1,000 to 50,000 is alkali-soluble.

As to the ratio of the light-sensitive material to the alkali-soluble novolak resin to be used in the present invention, 5 to 100 parts by weight, preferably 7 to 40 parts by weight, of the light-sensitive material is used per 100 parts of the novolak resin. If the amount of the light-sensitive substance is less than 5 parts by weight, there results a seriously decreased film-remaining ratio, whereas if the amount used is more than 100 parts by weight, there result a decreased sensitivity and a decreased solubility in the solvent.

In the present invention, the aforesaid light-sensitive material may be the primary light-sensitive material used, but, if necessary, ordinary light-sensitive materials such as ester compounds formed between 2,3,4-trihydroxybenzophenone, 2,4,4'-trihydroxybenzophenone, 2,4,6-trihydroxybenzophenone, 2,3,4,4'-tetrahydroxybenzophenone, etc. and 1,2-naphthoquinonediazido-5-sulfonyl chloride and/or 1,2-naphthoquinonediazido-4-sulfonyl chloride may be used together with the light-sensitive material of the present invention. In this case, these ordinary light-sensitive materials may be used in an amount of up to 100 parts by weight, preferably up to 30 parts by weight, per 100 parts by weight of the light-sensitive material of the present invention represented by, for example, the foregoing general formulae (II) to (IX).

The composition of the present invention may further contain a polyhydroxy compound for promoting dissolution into a developer. Preferable examples of such polyhydroxy compounds include phenols, resorcin, phloroglucin, 2,3,4-trihydroxybenzophenone, 2,3,4,4'-tetrahydroxybenzophenone, 2,3,4,3',4',5'-hexahydroxybenzophenone, and acetone-pyrogallol condensate resin.

Solvents for dissolving the light-sensitive material and the alkali-soluble novolak resin in accordance with the present invention include illustrated ketones such as methyl ethyl ketone and cyclohexanone, alcohol ethers such as ethylene glycol monomethyl ether and ethylene glycol monoethyl ether, ethers such as dioxane and ethylene glycol dimethyl ether, cellosolve esters such as methyl cellosolve acetate and ethyl cellosolve acetate, fatty acid esters such as methyl lactate, ethyl lactate and butyl acetate, halogenated hydrocarbons such as 1,1,2-trichloroethylene, and highly polar solvents such as dimethylacetamide, N-methylpyrrolidone, dimethylformamide and dimethylsulfoxide. These solvents may be used either alone or in combination of two or more of them.

The positive-working photoresist composition of the present invention may contain, if necessary, a dye, a plasticizer, an adhesion aid, and/or a surfactant. Specific examples of the dye include Methyl Violet, Crystal Violet, and Malachite Green; specific examples of the plasticizers include stearic acid, acetal resin, phenoxy resin and alkyd resin; specific examples of the adhesion aid include hexamethyldisilazane and chloromethylsilane; and specific examples of the surfactant include nonylphenoxypoly(ethyleneoxy)ethanol and octylphenoxypoly(ethyleneoxy)ethanol.

The positive-working photoresist composition of the present invention can be coated on a base board such as a semiconductor wafer, a glass plate, a ceramic plate or a metal plate in a thickness of 0.5 to 0.3 μm according to the spin-coating method or the roller-coating method.

Then, the coated layer is heated and dried, exposed to UV rays or the like through an exposure mask to print a circuit pattern thereon, and then developed to obtain a positive image. Further, patternwise etching using this positive image as a mask enables patternwise processing. Typical fields for applying the composition include a process of manufacturing semiconductors such as IC, a process of manufacturing circuit bases for liquid crystal, thermal head or the like, and other photofabrication processes as described in U.S. Pat. No. 4,639,406.

A good resist can be obtained by coating the above-described positive-working photoresist composition on a substrate for use in manufacture of fine integrated circuit elements (e.g., silicon/silicon dioxide coating) according to a proper coating method using, for example, a spinner or a coater, exposing the coated composition through a predetermined mask, and then developing it.

As a developing solution for the positive photoresist composition of the present invention, there may be used aqueous solutions of alkalis such as inorganic alkalis (e.g., sodium hydroxide, potassium hydroxide, sodium carbonate, sodium silicate, sodium metasilicate and aqueous ammonia), primary amines (e.g., ethylamine and n-propylamine), secondary amines (e.g., diethylamine and di-n-butylamine), tertiary amines (e.g., triethylamine and methyldiethylamine), alcoholamines (e.g., dimethylethanolamine and triethanolamine), quaternary ammonium salts (e.g., tetramethylammoium hydroxide and tetraethylammonium hydroxide), and cyclic amines(e.g., pyrrole and piperidine). The above-described aqueous alkali solutions may further contain proper amounts of alcohols and surfactants.

The positive-working photoresist of the present invention is excellent in resolving power, reproduction fidelity, profile pattern of resist pattern, development latitude, heat resistance and storage stability of the resist.

The present invention is now illustrated in greater detail by reference to the following examples which, however, are not to be construed as limiting the present invention in any way. Unless otherwise indicated, all percents are by weight.

EXAMPLES 1 TO 20 AND COMPARATIVE EXAMPLES 21 TO 25

(1) Synthesis of Light-Sensitive Material (a)

10 g of the following compound (a'),

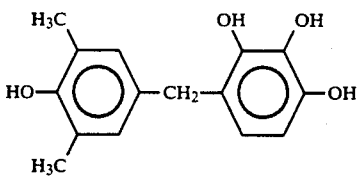

(a')

31.0 g of 1,2-naphthoquinonediazido-5-sulfonyl chloride and 350 ml of acetone were charged in a three-necked flask to prepare a uniform solution. Thereafter, a mixed solution of triethylamine/acetone (=12.3 9/50 ml) was gradually added dropwise thereto, and the reaction was conducted at 25° C. for 3 hours. The reaction mixture was then poured into 1600 ml of a 1% hydrochloric acid aqueous solution. The precipitate formed was collected by filtration, washed with water, and dried (at 40° C.) to obtain 34.0 g .of 1,2-naphthoquinonediazido-5-sulfonic acid ester of the compound (a').

(2) Synthesis of Light-Sensitive Material (b)

10 g of the following compound (b'),

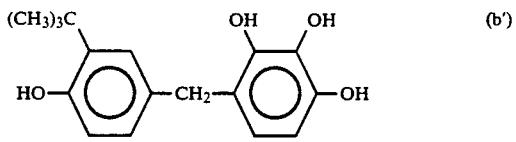

(b')

28.0 g of 1,2-naphthoquinonediazido-5-sulfonyl chloride and 320 ml of acetone were charged in a three-necked flask to prepare a uniform solution. Thereafter, a mixed solution of triethylamine/acetone (=11.1 g/45 ml) was gradually added dropwise thereto, and the reaction was conducted at 25° C. for 3 hours. The reaction mixture was then poured into 1500 ml of a 1% hydrochloric acid aqueous solution. The precipitate formed was collected by filtration, washed with water, and dried (at 40° C.) to obtain 31.9 g of 1,2-naphthoquinonediazido-5-sulfonic acid ester of the compound (b').

(3) Synthesis of Light-Sensitive Material (c):

10 g of the following compound (c'),

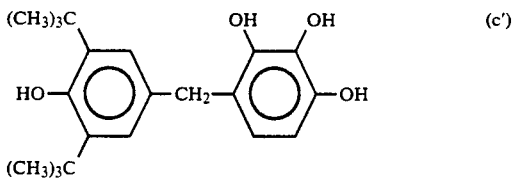

(c')

23.4 g of 1,2-naphthoquinonediazido-5-sulfonyl chloride and 260 ml of acetone were charged in a three-necked flask to prepare a uniform solution. Thereafter, a mixed solution of triethylamine/acetone (=9.3 g/40 ml) was gradually added dropwise thereto, and the reaction was conducted at 25° C. for 3 hours. The reaction mixture was then poured into 1200 ml of a 1% hydrochloric acid aqueous solution. The precipitate formed was collected by filtration, washed with water, and dried (at 40° C.) to obtain 28.2 g of 1,2-naphthoquinonediazido-5-sulfonic acid ester of the compound (c').

(4) Synthesis of Light-Sensitive Material (d)

10 g of the following compound (d'),

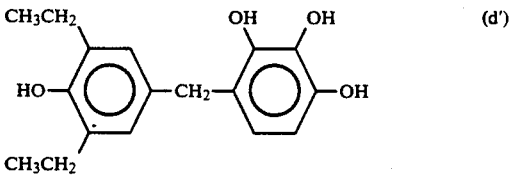

(d')

28.0 g of 1,2-naphthoquinonediazido-5-sulfonyl chloride and 320 ml of acetone were charged in a three-necked flask to prepare a uniform solution. Thereafter, a mixed solution of triethylamine/acetone (=11.1 g/45 ml) was gradually added dropwise thereto, and the reaction was conducted at 25° C. for 3 hours. The reaction mixture was then poured into 1500 ml of a 1% hydrochloric acid aqueous solution. The precipitate formed was collected by filtration, washed with water, and dried (at 40° C.) to obtain 31.4 g of 1,2-naphthoquinonediazido-5-sulfonic acid ester of the compound (d').

(5) Synthesis of Light-Sensitive Material (e)

10 g of the following compound (e'),

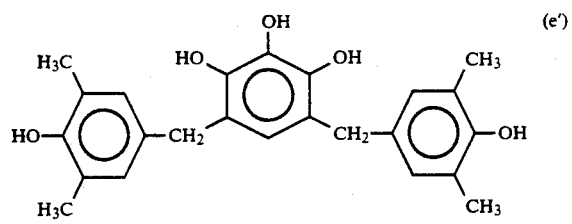

20.5 g of 1,2-naphthoquinonediazido-5-sulfonyl chloride and 230 ml of acetone were charged in a three-necked flask to prepare a uniform solution. Thereafter, a mixed solution of triethylamine/acetone (=8.1 g/33 ml) was gradually added dropwise thereto, and the reaction was conducted at 25° C. for 3 hours. The reaction mixture was then poured into 1100 ml of a 1% hydrochloric acid aqueous solution. The precipitate formed was collected by filtration, washed with water, and dried (at 40° C.) to obtain 25.4 g of 1,2-naphthoquinonediazido-5-sulfonic acid ester of the compound (e').

(6) Synthesis of Light-Sensitive Material (f)

10 g of the aforesaid compound (e'), 34.1 g of 1,2-naphthoquinonediazido-5-sulfonyl chloride and 390 ml of acetone were charged in a three-necked flask to prepare a uniform solution. Thereafter, a mixed solution of 4-dimethylaminopyridine/acetone (=16.3 g/250 ml) was gradually added dropwise thereto, and the reaction was conducted at 25° C. for 3 hours. The reaction mixture was then poured into 3000 ml of a 1% hydrochloric acid aqueous solution. The precipitate formed was collected by filtration, washed with water, and dried (at 40° C.) to obtain 35.7 g of 1,2-naphthoquinonediazido-5-sulfonic acid ester of the compound (e').

(7) Synthesis of Light-Sensitive Material (g)

10 g of the aforesaid compound (e'), 34.1 g of 1,2-naphthoquinonediazido-5-sulfonyl chloride and 390 ml of acetone were charged in a three-necked flask to prepare a uniform solution. Thereafter, a mixed solution of 4-dimethylaminopyridine/acetone (=16.3 g/250 ml) was gradually added dropwise thereto, and the reaction was conducted at 25° C. for 3 hours. The reaction mixture was then poured into 3000 ml of a 1% hydrochloric acid aqueous solution. The precipitate formed was collected by filtration, washed with water, and dried (at 40° C.) to obtain 37.0 g of 1,2-naphthoquinonediazido-5-sulfonic acid ester of the compound (e').

(8) Synthesis of Light-Sensitive Material (h)

10 g of the following compound (h'),

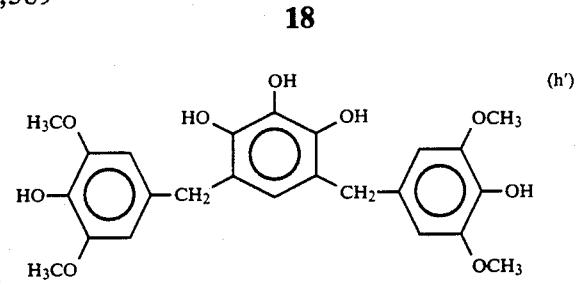

26.4 g of 1,2-naphthoquinonediazido-5-sulfonyl chloride and 300 ml of acetone were charged in a three-necked flask to prepare a uniform solution. Thereafter, a mixed solution of 4-dimethylaminopyridine/acetone (=12.6 g/190 ml) was gradually added dropwise thereto, and the reaction was conducted at 25° C. for 3 hours. The reaction mixture was then poured into 2500 ml of a 1% hydrochloric acid aqueous solution. The precipitate formed was collected by filtration, washed with water, and dried (at 40° C.) to obtain 30.6 g of 1,2-naphthoquinonediazido-5-sulfonic acid ester of the compound (h').

(9) Synthesis of Light-Sensitive Material (i)

10 g of the following compound (i'),

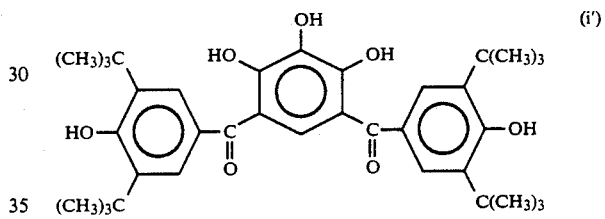

13.7 g of 1,2-naphthoquinonediazido5-sulfonyl chloride and 160 ml of acetone were charged in a three-necked flask to prepare a uniform solution. Thereafter, a mixed solution of triethylamine/acetone (=5.4 g/25 ml) was gradually added dropwise thereto, and the reaction was conducted at 25° C. for 3 hours. The reaction mixture was then poured into 1000 ml of a 1% hydrochloric acid aqueous solution. The precipitate formed was collected by filtration, washed with water, and dried (at 40° C.) to obtain 19.4 g of 1,2-naphthoquinonediazido-5-sulfonic acid ester of the compound (i').

Synthesis of Light-Sensitive Material (j)

10 g of the following compound (j'),

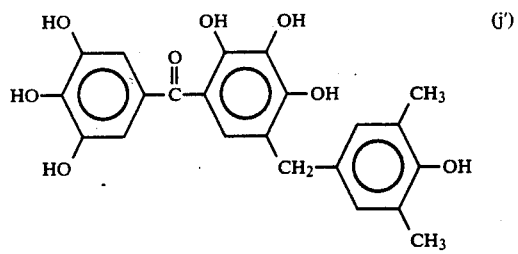

41.6 g of 1,2-naphthoquinonediazido-5-sulfonyl chloride and 470 ml of acetone were charged in a three-necked flask to prepare a uniform solution. Thereafter, a mixed solution of triethylamine/acetone (=16.5 g/67 ml) was gradually added dropwise thereto, and the reaction was conducted at 25° C. for 3 hours. The reaction mixture was then poured into 3000 ml of a 1% hydrochloric acid aqueous solution. The precipitate formed was collected by filtration, washed with water, and dried (at 40° C.) to obtain 42.8 g of 1,2-naphthoquinonediazido-5-sulfonic acid ester of the compound (j').

(11) Synthesis of Light-Sensitive Material (k)

10 g of the following compound (k'),

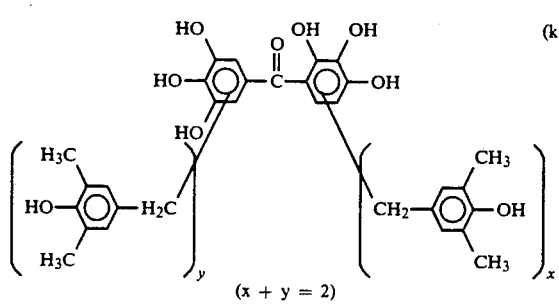

29.5 g of 1,2-naphthoquinonediazido-5-sulfonyl chloride and 330 ml of acetone were charged in a three-necked flask to prepare a uniform solution. Thereafter, a mixed solution of triethylamine/acetone (=11.7 g/50 ml) was gradually added dropwise thereto, and the reaction was conducted at 25° C. for 3 hours. The reaction mixture was then poured into 2000 ml of a 1% hydrochloric acid aqueous solution. The precipitate formed was collected by filtration, washed with water, and dried (at 40° C.) to obtain 33.6 g of 1,2-naphthoquinonediazido-5-sulfonic acid ester of the compound (k').

(12) Synthesis of Light-Sensitive Material (l)

10 g of the following compound (l'),

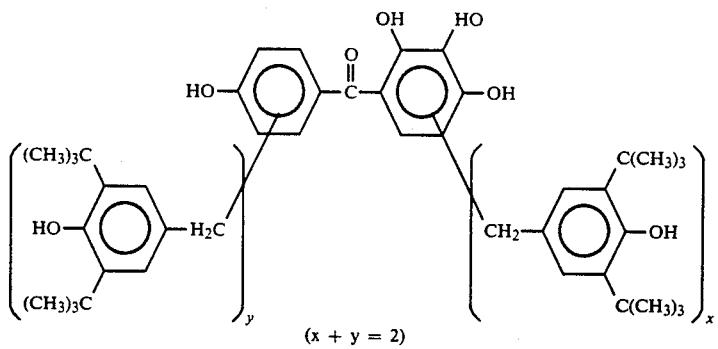

15.8 g of 1,2-naphthoquinonediazido-5-sulfonyl chloride and 200 ml of acetone were charged in a three-necked flask to prepare a uniform solution. Thereafter, a mixed solution of triethylamine/acetone (=6.2 g/30 ml) was gradually added dropwise thereto, and the reaction was conducted at 25° C. for 3 hours. The reaction mixture was then poured into 1000 ml of a 1% hydrochloric acid aqueous solution. The precipitate formed was collected by filtration, washed with water, and dried (at 40° C.) to obtain 21.4 g of 1,2-naphthoquinonediazido-5-sulfonic acid ester of the compound (l').

(13) Synthesis of Light-Sensitive Material (m)

10 g of the following compound (m'),

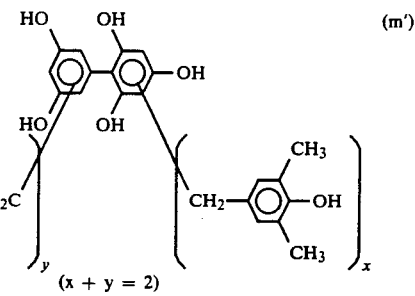

27.2 g of 1,2-naphthoquinonediazido-5-sulfonyl chloride and 300 ml of acetone were charged in a three-necked flask to prepare a uniform solution. Thereafter, a mixed solution of triethylamine/acetone (=10.8 g/45 ml) was gradually added dropwise thereto, and the reaction was conducted at 25° C. for 3 hours. The reaction mixture was then poured into 1800 ml of a 1% hydrochloric acid aqueous solution. The precipitate formed was collected by filtration, washed with water, and dried (at 40° C.) to obtain 32.0 g of 1,2-naphthoquinonediazido-5-sulfonic acid ester of the compound (m').

(14) Synthesis of Light-Sensitive Material (n)

10 g of the following compound (n'),

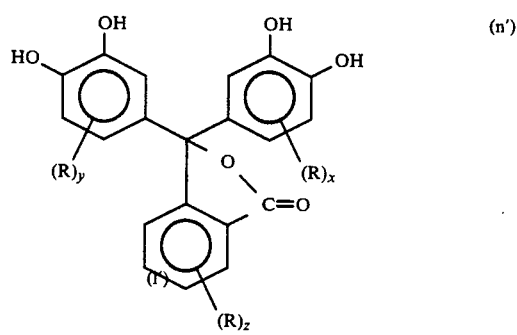

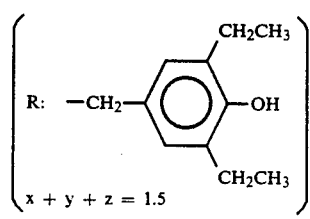

18.1 g of 1,2-naphthoquinonediazido-5-sulfonyl chloride and 210 ml of acetone were charged in a three-necked flask to prepare a uniform solution. Thereafter, a mixed solution of triethylamine/acetone (=7.2 g/30 ml) was gradually added dropwise thereto, and the reaction was conducted at 25° C. for 3 hours. The reaction mixture was then poured into 1000 ml of a 1% hydrochloric acid aqueous solution. The precipitate formed was collected by filtration, washed with water, and dried (at 40° C.) to obtain 23.0 g of 1,2-naphthoquinonediazido-5-sulfonic acid ester of the compound (n').

(15) Synthesis of Light-Sensitive Material (o)

10 g of the following compound (o'),

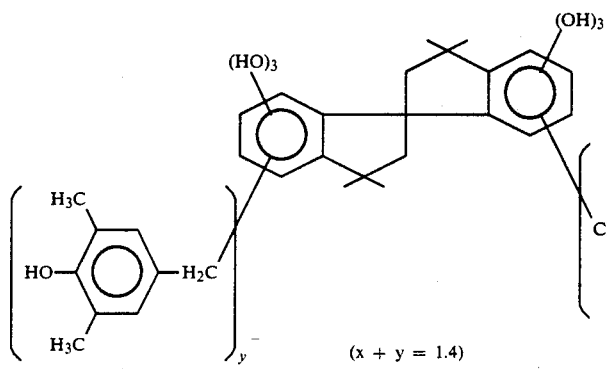

26.6 g Of 1,2-naphthoquinonediazido-5-sulfonyl chloride and 300 ml of acetone were charged in a three-necked flask to prepare a uniform solution. Thereafter, a mixed solution of triethylamine/acetone (=10.5 g/45 ml) was gradually added dropwise thereto, and the reaction was conducted at 25° C. for 3 hours. The reaction mixture was then poured into 1400 ml of a 1% hydrochloric acid aqueous solution. The precipitate formed was collected by filtration, washed with water, and dried (at 40° C.) to obtain 31.1 g of 1,2-naphthoquinonediazido-5-sulfonic acid ester of the compound (o').

(16) Synthesis of Light-Sensitive Material (p)

10 g of the following compound (p'),

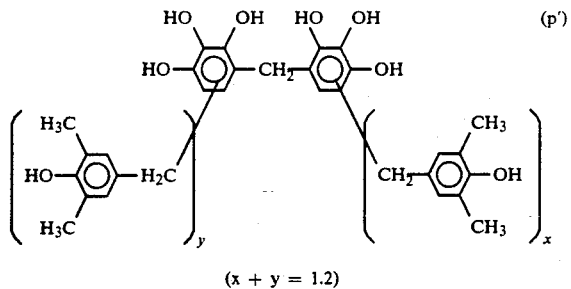

38.0 g of 1,2-naphthoquinonediazido-5-sulfonyl chloride and 430 ml of acetone were charged in a three-necked flask to prepare a uniform solution. Thereafter, a mixed solution of triethylamine/acetone (=15.0 g/60 ml) was gradually added dropwise thereto, and the reaction was conducted at 25° C. for 3 hours. The reaction mixture was then poured into 2000 ml of a 1% hydrochloric acid aqueous solution. The precipitate formed was collected by filtration, washed with water, and dried (at 40° C.) to obtain 40.8 g of 1,2-naphthoquinonediazido-5-sulfonic acid ester of the compound (p').

(17) Synthesis of Light-Sensitive Material (q)

10 g of the following compound (q'),

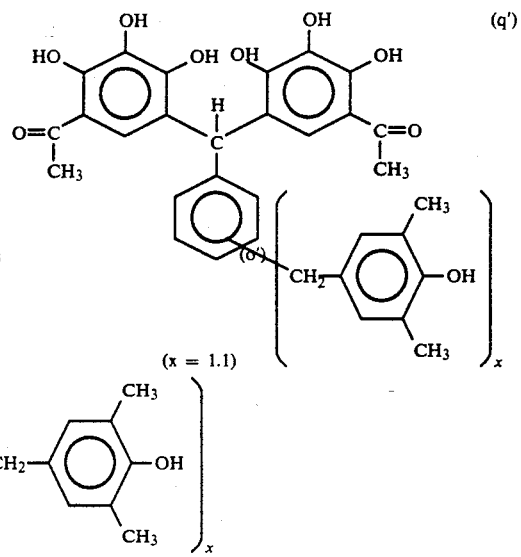

27.3 g of 1,2-naphthoquinonediazido-5-sulfonyl chloride and 310 ml of acetone were charged in a three-necked flask to prepare a uniform solution. Thereafter, a mixed solution of triethylamine/acetone (=10.8 g/45 ml) was gradually added dropwise thereto, and the reaction was conducted at 25° C. for 3 hours. The reaction mixture was then poured into 1500 ml of a 1% hydrochloric acid aqueous solution. The precipitate formed was collected by filtration, washed with water, and dried (at 40° C.) to obtain 30.8 g of 1,2-naphthoquinonediazido-5-sulfonic acid ester of the compound (q').

(18) Synthesis of Light-Sensitive Material (r)

10 g of the following compound (r'),

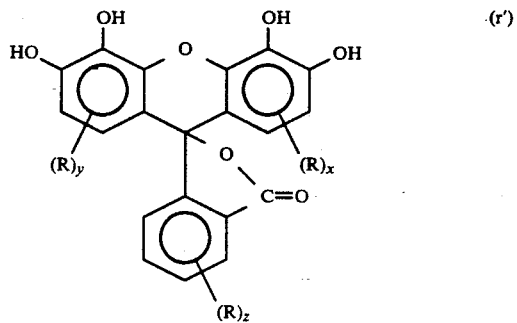

-continued

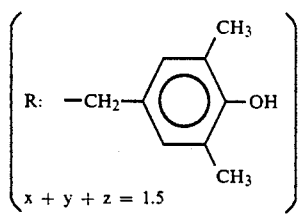

19.0 g of 1,2-naphthoquinonediazido-5-sulfonyl chloride and 220 ml of acetone were charged in a three-necked flask to prepare a uniform solution. Thereafter, a mixed solution of triethylamine/acetone (=7.5 g/30 ml) was gradually added dropwise thereto, and the reaction was conducted at 25° C. for 3 hours. The reaction mixture was then poured into 1000 ml of a 1% hydrochloric acid aqueous solution. The precipitate formed was collected by filtration, washed with water, and dried (at 40° C.) to obtain 23.8 g of 1,2-naphthoquinonediazido-5-sulfonic acid ester of the compound (r').

(19) Synthesis of Light-Sensitive Material (s)

10 g of the following compound (s'),

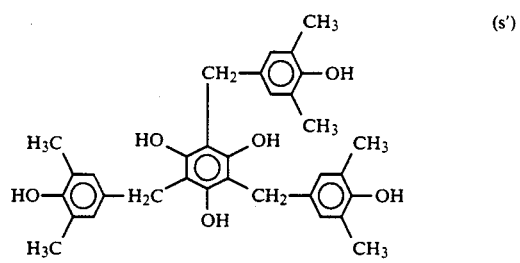

25.4 g of 1,2-naphthoquinonediazido-5-sulfonyl chloride and 300 ml of acetone were charged in a three-necked flask to prepare a uniform solution. Thereafter, a mixed solution of triethylamine/acetone (=10.0 g/40 ml) was gradually added dropwise thereto, and the reaction was conducted at 25° C. for 3 hours. The reaction mixture was then poured into 1500 ml of a 1% hydrochloric acid aqueous solution. The precipitate formed was collected by filtration, washed with water, and dried (at 40° C.) to obtain 29.8 g of 1,2-naphthoquinonediazido-5-sulfonic acid ester of the compound (s').

(20) Synthesis of Light-Sensitive Material (t)

10 g of the following compound (t'),

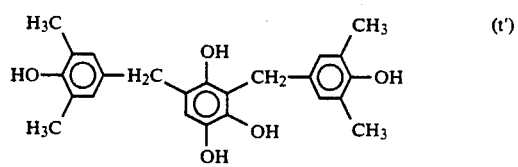

34.1 g of 1,2-naphthoquinonediazido-5-sulfonyl chloride and 400 ml of acetone were charged in a three-necked flask to prepare a uniform solution. Thereafter, a mixed solution of 4-dimethylaminopyridine/acetone (=16.3 g/250 ml) was gradually added dropwise thereto, and the reaction was conducted at 25° C. for 3 hours. The reaction mixture was then poured into 3000 ml of a 1% hydrochloric acid aqueous solution. The precipitate formed was collected by filtration, washed with water, and dried (at 40° C.) to obtain 37.5 g of 1,2-naphthoquinonediazido-5-sulfonic acid ester of the compound (t').

(21) Synthesis of Light-Sensitive Material (u)
(Comparative Example 1)

7.85 g of 2,3,4,4'-tetrahydroxybenzophenone (u') of the following formula (u'),

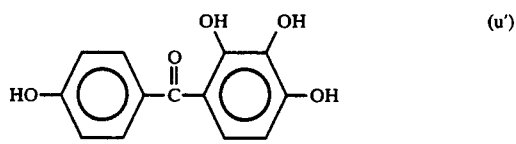

30 g of 1,2-naphthoquinonediazido-5-sulfonyl chloride and 300 ml of acetone were charged in a three-necked flask to prepare a uniform solution. Thereafter, a mixed solution of triethylamine/acetone (=11.3 g/30 ml) was gradually added dropwise thereto, and the reaction was conducted at 25° C. for 3 hours. The reaction mixture was then poured into 1500 ml of a 1% hydrochloric acid aqueous solution. The precipitate formed was collected by filtration, washed with water, and dried (at 40° C.) to obtain 27.5 g of 1,2-naphthoquinonediazido-5-sulfonic acid ester of 2,3,4,4'-tetrahydroxybenzophenone (u').

Synthesis of Light-Sensitive Material (v) (Comparative Example 2)

10 g of the following compound (v'),

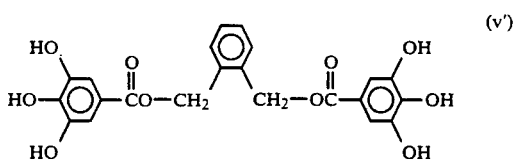

31.6 g of 1,2-naphthoquinonediazido-5-sulfonyl chloride and 350 ml of acetone were charged in a three-necked flask to prepare a uniform solution. Thereafter, a mixed solution of triethylamine/acetone (=12.5 g/50 ml) was gradually added dropwise thereto, and the reaction was conducted at 25° C. for 3 hours. The reaction mixture was then poured into 1600 ml of a 1% hydrochloric acid aqueous solution. The precipitate formed was collected by filtration, washed with water, and dried (at 40° C.) to obtain 34.1 g of 1,2-naphthoquinonediazido-5 sulfonic acid ester of the compound (v').

(23) Synthesis of Light-Sensitive Material (w)
(Comparative Example 3)

10 g of the following compound (w'),

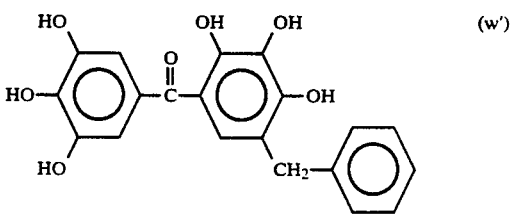

39.4 g of 1,2-naphthoquinonediazido-5-sulfonyl chloride and 450 ml of acetone were charged in a three-necked flask to prepare a uniform solution. Thereafter, a mixed solution of triethylamine/acetone (=15.6 g/70 ml) was gradually added dropwise thereto, and the reaction was conducted at 25° C. for 3 hours. The reaction mixture was then poured into 2500 ml of a 1% hydrochloric acid aqueous solution. The precipitate formed was collected by filtration, washed with water, and dried (at 40° C.) to obtain 41.4 g of 1,2-naphthoquinonediazido-5-sulfonic acid ester of the compound (w').

(24) Synthesis of Light-Sensitive Material (x) (Comparative Example 4)

10 g of the following compound (x'),

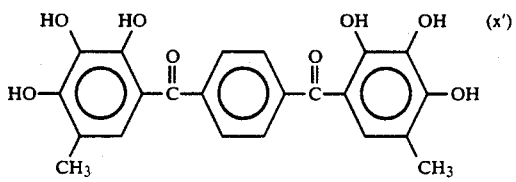

26.8 g of 1,2-naphthoquinonediazido-5-sulfonyl chloride and 300 ml of acetone were charged in a three-necked flask to prepare a uniform solution. Thereafter, a mixed solution of triethylamine/acetone (=10.6 g/45 ml) was gradually added dropwise thereto, and the reaction was conducted at 25° C. for 3 hours. The reaction mixture was then poured into 1400 ml of a 1% hydrochloric acid aqueous solution. The precipitate formed was collected by filtration, washed with water, and dried (at 40° C.) to obtain 30.5 g of 1,2-naphthoquinonediazido-5-sulfonic acid ester of the compound (x').

(25) Synthesis of Light-Sensitive Material (y) (Comparative Example 5)

10 g of the following compound (y'),

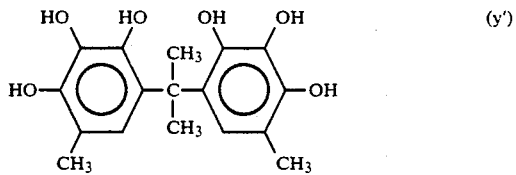

43.8 g of 1,2-naphthoquinonediazido-5-sulfonyl chloride and 500 ml of acetone were charged in a three-necked flask to prepare a uniform solution. Thereafter, a mixed solution of triethylamine/acetone (=17.3 g/70 ml) was gradually added dropwise thereto, and the reaction was conducted at 25° C. for 3 hours. The reaction mixture was then poured into 2500 ml of a 1% hydrochloric acid aqueous solution. The precipitate formed was collected by filtration, washed with water, and dried (at 40° C.) to obtain 45.2 g of 1,2-naphthoquinonediazido-5-sulfonic acid ester of the compound (y').

(26) Synthesis of Novolak Resin 40 g of m-cresol, 60 g of p-cresol, 49.5 g of a 37% formaldehyde aqueous solution, and 0.05 g of oxalic acid were charged in a three-necked flask, and the mixture was heated to 100° C. under stirring to react for 7 hours. After completion of the reaction, the reaction mixture was cooled to room temperature, and the pressure was reduced to 30 mmHg. Thereafter, the mixture was gradually heated to 150° C., and water and unreacted monomer were removed. The thus obtained novolak resin had a weight-average molecular weight (polystyrene-reduced value) of 7,000.

(27) Preparation of Positive-working Photoresists and Evaluation Thereof 1.10 g of each of the above-described light-sensitive materials (a) to (y) obtained in (1) to (25) and 5 g of the cresol novolak resin (molecular weight: 7,000) obtained in (26) described above were dissolved in 18 g of ethyl cellosolve acetate. The resulting solution was filtered through a 0.2-μm microfilter to prepare photoresist compositions. Each of the photoresists was coated on a silicon wafer using a spinner, and dried at 110° C. for 30 minutes in a convection oven in a nitrogenous atmosphere to form a 1.2-μm thick resist film. The thus formed films were exposed using a reduction projection optical printer (NSR 1505 made by Nikon Co., Ltd.), developed for 1 minute in a 2.38% aqueous solution of tetramethylammonium hydroxide, then washed with water for 30 minutes and dried. Resist patterns of the silicon wafers thus obtained were observed under a scanning electron microscope to evaluate the resists. Results thus obtained are shown in Table 1.

Sensitivity is defined as a reciprocal of an exposure amount capable of reproducing a 1.0-μm mask pattern, and is presented as relative values taking the sensitivity of Comparative Example 1 as 1.0.

Film-remaining ratio is presented in terms of percentage of remaining film in an unexposed portion after development based on before development.

Resolving power represents a limiting resolving power in an exposure amount capable of reproducing a 1.0-μm mask pattern.

Heat resistant is presented in terms of a temperature at which a patterned resist formed on a silicon wafer is not deformed after baking for 30 minutes in a convection oven.

Profile of the resist is presented in terms of an angle (θ) formed by the resist wall in the 1.0μm resist pattern section with the plane of silicon wafer.

TABLE 1

| | Light-Sensitive Material | Relative Sensitivity | Film-Remaining Ratio (%) | Resolving Power (μm) | Heat Resistance (°C.) | Resist Profile (θ) |
|---|---|---|---|---|---|---|
| Example 1 | a | 1.3 | 99 | 0.70 | 135 | 89 |
| Example 2 | b | 1.2 | 100 | 0.70 | 135 | 89 |
| Example 3 | c | 1.1 | 100 | 0.70 | 135 | 89 |
| Example 4 | d | 1.2 | 100 | 0.70 | 140 | 89 |
| Example 5 | e | 1.3 | 99 | 0.70 | 135 | 88 |
| Example 5' | e | 1.4 | 99 | 0.57 | 135 | 88 |
| Example 6 | f | 1.1 | 100 | 0.65 | 145 | 89 |

TABLE 1-continued

| | | Results of Evaluation | | | | |
|---|---|---|---|---|---|---|
| | Light-Sensitive Material | Relative Sensitivity | Film-Remaining Ratio (%) | Resolving Power (μm) | Heat Resistance (°C.) | Resist Profile (θ) |
| Example 6' | f | 1.2 | 100 | 0.55 | 145 | 89 |
| Example 7 | g | 1.2 | 100 | 0.55 | 140 | 89 |
| Example 8 | h | 1.1 | 100 | 0.65 | 140 | 89 |
| Example 9 | i | 1.1 | 99 | 0.70 | 135 | 88 |
| Example 10 | j | 1.3 | 100 | 0.65 | 140 | 89 |
| Example 11 | k | 1.4 | 99 | 0.70 | 135 | 87 |
| Example 11' | k | 1.3 | 99 | 0.55 | 135 | 88 |
| Example 12 | l | 1.2 | 99 | 0.70 | 140 | 87 |
| Example 13 | m | 1.4 | 99 | 0.65 | 135 | 89 |
| Example 14 | n | 1.2 | 99 | 0.65 | 135 | 89 |
| Example 14' | n | 1.2 | 100 | 0.54 | 135 | 89 |
| Example 15 | o | 1.1 | 100 | 0.70 | 145 | 88 |
| Example 16 | p | 1.1 | 100 | 0.75 | 135 | 87 |
| Example 17 | q | 1.2 | 99 | 0.70 | 135 | 89 |
| Example 18 | r | 1.3 | 100 | 0.70 | 140 | 89 |
| Example 19 | s | 1.1 | 100 | 0.70 | 135 | 87 |
| Example 20 | t | 1.2 | 100 | 0.65 | 145 | 89 |
| Comparative Example 1 | u | 1.0 | 98 | 0.80 | 130 | 86 |
| Comparative Example 1' | u | 1.0 | 98 | 0.70 | 130 | 85 |
| Comparative Example 2 | v | 0.9 | 97 | 0.80 | 130 | 85 |
| Comparative Example 3 | w | 1.1 | 98 | 0.80 | 130 | 86 |
| Comparative Example 3' | w | 1.1 | 97 | 0.68 | 130 | 85 |
| Comparative Example 4 | x | 1.0 | 97 | 0.80 | 125 | 85 |
| Comparative Example 4 | y | 1.0 | 98 | 0.80 | 120 | 84 |
| Comparative Example 5' | y | 0.9 | 97 | 0.70 | 120 | 86 |

Notes:
In Examples 5', 6', 7, 11', 14' and Comparative Examples 1', 3' and 5', i line exposure was employed. In these cases, sensitivity values were shown as relative values taking the sensitivity of Comparative Example 1' as 1.0.
In other Examples and Comparative Examples than are described above, g line exposure was employed.

As can be seen from above, resists using the light-sensitive materials (a) to (t) in accordance with the present invention showed particularly excellent resolving power and resist profile. The light-sensitive materials in accordance with the present invention also possess excellent solubility in ethyl cellosolve acetate. The resist compositions using these light-sensitive materials of the present invention suffered formation of no precipitates even after being allowed to stand for 30 days at 40° C., whereas the resist compositions using the light-sensitive materials (u), (v) and (x) of Comparative Examples suffered formation of precipitates after being allowed to stand under the same conditions.

While the invention has been described in detail and with reference to specific embodiments thereof, it will be apparent to one skilled in the art that various changes and modifications can be made therein without departing from the spirit and scope thereof.

We claim:

1. A positive-working photoresist composition, which contains an admixture of (1) a light-sensitive material obtained by reacting a polyhydroxy compound selected from those represented by any of formulae (II) to (IX) with at least one of 1,2-naphtho-quinonediazido-5-sulfonyl chloride and 1,2-naphtho-quinonediazido-4-sulfonyl chloride, and (2) an alkali-soluble novolak resin:

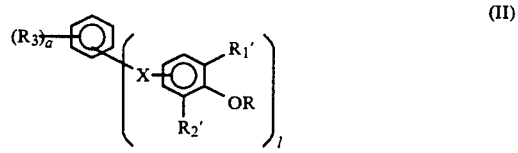

(II)

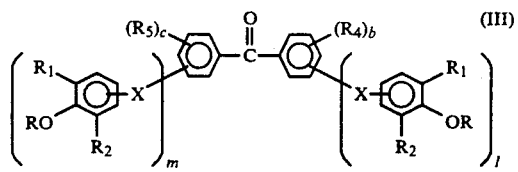

(III)

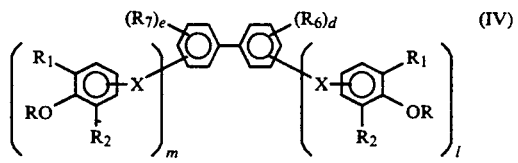

(IV)

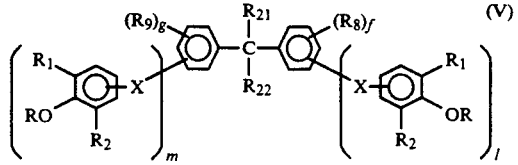

(V)

-continued

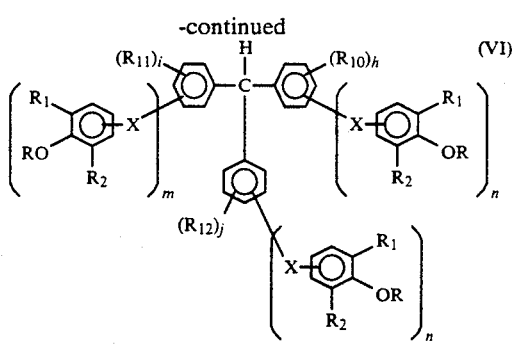
(VI)

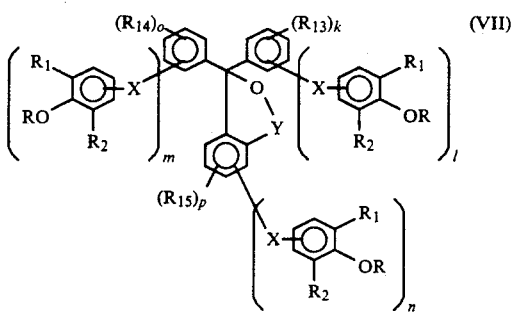
(VII)

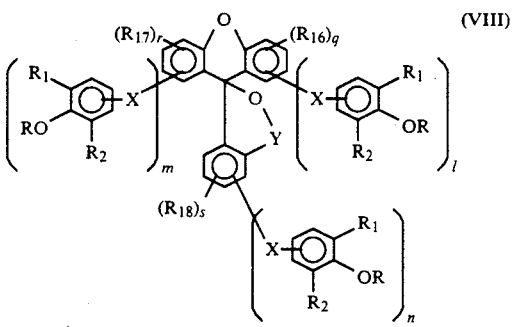
(VIII)

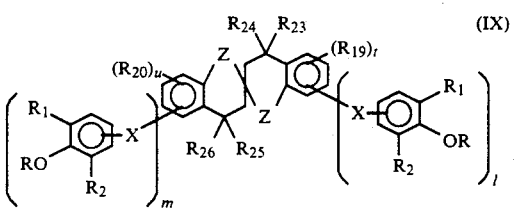
(IX)

wherein $R_1'$ and $R_2'$ each represents a $C_1$–$C_4$ straight or branched alkyl or alkoxy group; wherein $R_1$ and $R_2$ each represents a hydrogen atom or a $C_1$–$C_4$ straight or branched alkyl or alkoxy group, provided that $R_1$ and $R_2$ do not represent hydrogen atoms at the same time; X represents a divalent organic group; R represents —H.

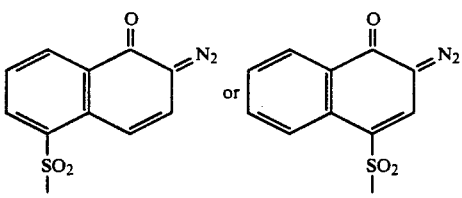

which may be the same or different; $R_3$ to $R_{20}$, which may be the same or different, each represents —H, —OH, a substituted or unsubstituted alkyl group, a substituted or unsubstituted alkoxy group, a substituted or unsubstituted aryl group, a substituted or unsubstituted aralkyl group, a substituted or unsubstituted acyl group, a substituted or unsubstituted acyloxy group,

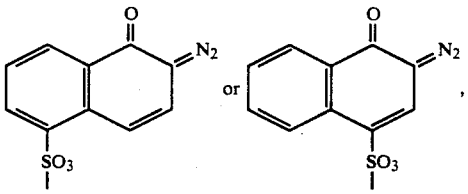

provided that $1 \leq$

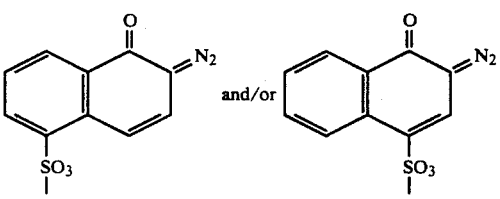
and/or $\leq 9$ within one molecule of the light-sensitive material; $R_{21}$ to $R_{26}$ each represents —H, —OH, —COOH, —CN, a halogen atom, —COOR$_{27}$, —R$_{28}$—COOH, —R$_{29}$—COOR$_{30}$ (wherein $R_{27}$ and $R_{30}$ each represents a substituted or unsubstituted alkyl group, a substituted or unsubstituted aryl group, a substituted or unsubstituted aralkyl group, and $R_{28}$ and $R_{29}$ each represents a substituted or unsubstituted alkylene group or a substituted or unsubstituted arylene group), a substituted or unsubstituted alkyl group, a substituted or unsubstituted alkoxy group, or a substituted or unsubstituted aralkyl group; Y represents

or —SO$_2$—; Z represents an oxygen atom or a single bond; and a to u represent real numbers satisfying the following conditions:

$1 \leq l \leq 4$,
$0 \leq m, n \leq 4$,
$0 \leq a$ to $k$, and $o$ to $u \leq 5$.

2. The positive-working photoresist composition of claim 1, wherein both $R_1$ and $R_2$ represent $C_1$ to $C_4$ straight or branched alkyl or alkoxy groups.

3. The positive-working photoresist composition of claim 1, wherein X represents a $C_1$ to $C_4$ straight or branched alkylene group.

4. The positive-working photoresist composition of claim 1, wherein the polyhydroxy compound is reacted with 1,2-naphthoquinonediazido-5-sulfonyl chloride.

5. The positive-working photoresist composition of claim 1, wherein the polyhydroxy compound is reacted with 1,2-napohthoquinonediazido-4-sulfonyl chloride.

6. The positive-working photoresist composition of claim 1, wherein the polyhydroxy compound is represented by formula (II).

7. The positive-working photoresist composition of claim 1, wherein the polyhydroxy compound is represented by formula (III).

8. The positive-working photoresist composition of claim 1, wherein the polyhydroxy compound is represented by formula (IV).

9. The positive-working photoresist composition of claim 1, wherein the polyhydroxy compound is represented by formula (V).

10. The positive-working photoresist composition of claim 1, wherein the polyhydroxy compound is represented by formula (VI).

11. The positive-working photoresist composition of claim 1, wherein the polyhydroxy compound is represented by formula (VII).

12. The positive-working photoresist composition of claim 1, wherein the polyhydroxy compound is represented by formula (VIII).

13. The positive-working photoresist composition of claim 1, wherein the polyhydroxy compound is represented by formula (IX).

* * * * *

UNITED STATES PATENT AND TRADEMARK OFFICE
CERTIFICATE OF CORRECTION

PATENT NO. : 5,173,389
DATED : December 22, 1992
INVENTOR(S) : Kazuya Uenishi, et. al.

It is certified that error appears in the above-indentified patent and that said Letters Patent is hereby corrected as shown below:

Column 27, line 63,

Claim 1, line 3, after "material" insert --selected from those represented by any of formulae (II) to (IX)--;

lines 4-5, delete "selected from those represented by any of formulae (II) to (IX)".

Signed and Sealed this

Ninth Day of May, 1995

Attest:

BRUCE LEHMAN

Attesting Officer

Commissioner of Patents and Trademarks